United States Patent
Choi

(10) Patent No.: US 7,130,184 B2
(45) Date of Patent: Oct. 31, 2006

(54) PORTABLE TERMINAL WITH MULTIPURPOSE EARJACK

(75) Inventor: Kyeong-Jin Choi, Gumi-si (KR)

(73) Assignee: Samsung Electronics Co., Ltd. (KR)

( * ) Notice: Subject to any disclaimer, the term of this patent is extended or adjusted under 35 U.S.C. 154(b) by 111 days.

(21) Appl. No.: 10/727,656

(22) Filed: Dec. 5, 2003

(65) Prior Publication Data

US 2004/0116005 A1 Jun. 17, 2004

(30) Foreign Application Priority Data

Dec. 16, 2002 (KR) ............... 10-2002-0080312

(51) Int. Cl.
*H05K 5/00* (2006.01)
(52) U.S. Cl. .................. 361/679; 361/683; 710/62
(58) Field of Classification Search ............. 361/679, 361/683; 710/62–64
See application file for complete search history.

(56) References Cited

U.S. PATENT DOCUMENTS

| | | | |
|---|---|---|---|
| 5,783,926 A | | 7/1998 | Moon et al. |
| 5,842,045 A | * | 11/1998 | Nakamura .................. 710/63 |
| 6,069,960 A | * | 5/2000 | Mizukami et al. ............ 381/74 |
| 6,295,519 B1 | * | 9/2001 | Wagner et al. ................ 703/25 |
| 6,742,061 B1 | * | 5/2004 | Hellberg ...................... 710/58 |
| 6,965,950 B1 | * | 11/2005 | Nagasawa et al. ........... 710/16 |
| 2002/0099878 A1 | * | 7/2002 | Henrie et al. | |

FOREIGN PATENT DOCUMENTS

| | | |
|---|---|---|
| EP | 0 861 009 | 8/1998 |
| WO | WO 01/19060 | 3/2001 |
| WO | WO0165827 | 9/2001 |

* cited by examiner

*Primary Examiner*—Yean-Hsi Chang
(74) *Attorney, Agent, or Firm*—Roylance, Abrams, Berdo & Goodman, LLP

(57) ABSTRACT

A portable terminal connectable to various external accessories. The potable terminal includes an earjack in which the external accessories can be plugged; an analog-to-digital conversion (ADC) section for converting a resistance value of an external accessory plugged in the earjack into an ADC value; a memory for storing ADC values of the external accessories; and a controller for converting a resistance value of the external accessory plugged in the earjack into an ADC value by controlling the ADC section, determining what type of external accessory plugged in the earjack by comparing the converted ADC value with the ADC values stored in the memory, and performing a function of the plugged-in external accessory via a corresponding pin of the earjack.

6 Claims, 3 Drawing Sheets

PORTABLE TERMINAL WITH MULTIPURPOSE EARJACK

PRIORITY

This application claims priority under 35 U.S.C. § 119 to an application entitled "Multipurpose Earjack" filed in the Korean Intellectual Property Office on Dec. 16, 2002 and assigned Serial No. 2002-80312, the contents of which are incorporated herein by reference.

BACKGROUND OF THE INVENTION

1. Field of the Invention

The present invention relates generally to a portable terminal, and in particular, to a portable terminal having a multipurpose earjack in which various external accessories can be plugged to perform multimedia functions, and a method for controlling the same.

2. Description of the Related Art

As various functions are added to a portable terminal, the portable terminal can perform various new functions in addition to the existing call function. Currently, users can add external accessories such as an external camera and an MP3 player to the portable terminal.

However, a conventional 3-pole or 4-pole earjack used in the portable terminal is specialized for a particular function. Therefore, users could not use various external accessories such as a stereo earphone and an external camera with the portable terminal.

SUMMARY OF THE INVENTION

It is, therefore, an object of the present invention to provide a potable terminal having a multipurpose earjack in which various external accessories can be plugged to perform multimedia functions, and a method for controlling the same.

To achieve the above and other objects, there is provided a portable terminal connectable to various external accessories. The potable terminal comprises an earjack in which the external accessories can be plugged; an analog-to-digital conversion (ADC) section for converting a resistance value of an external accessory plugged in the earjack into an ADC value; a memory for storing ADC values of the external accessories; and a controller for converting a resistance value of the external accessory plugged in the earjack into an ADC value by controlling the ADC section, determining what type of external accessory plugged in the earjack by comparing the converted ADC value with the ADC values stored in the memory, and performing a function of the plugged-in external accessory via a corresponding pin of the earjack.

To achieve the above and other objects, there is provided a method for controlling a portable terminal connectable to various external accessories. The method comprises the steps of: detecting a resistance value of an external accessory plugged in an earjack when the external accessory is plugged in the earjack; converting the resistance value into an analog-to-digital conversion (ADC) value; determining what type of external accessory plugged in the earjack based on the converted ADC value; and performing a function of the plugged-in external accessory via a corresponding pin of the earjack.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
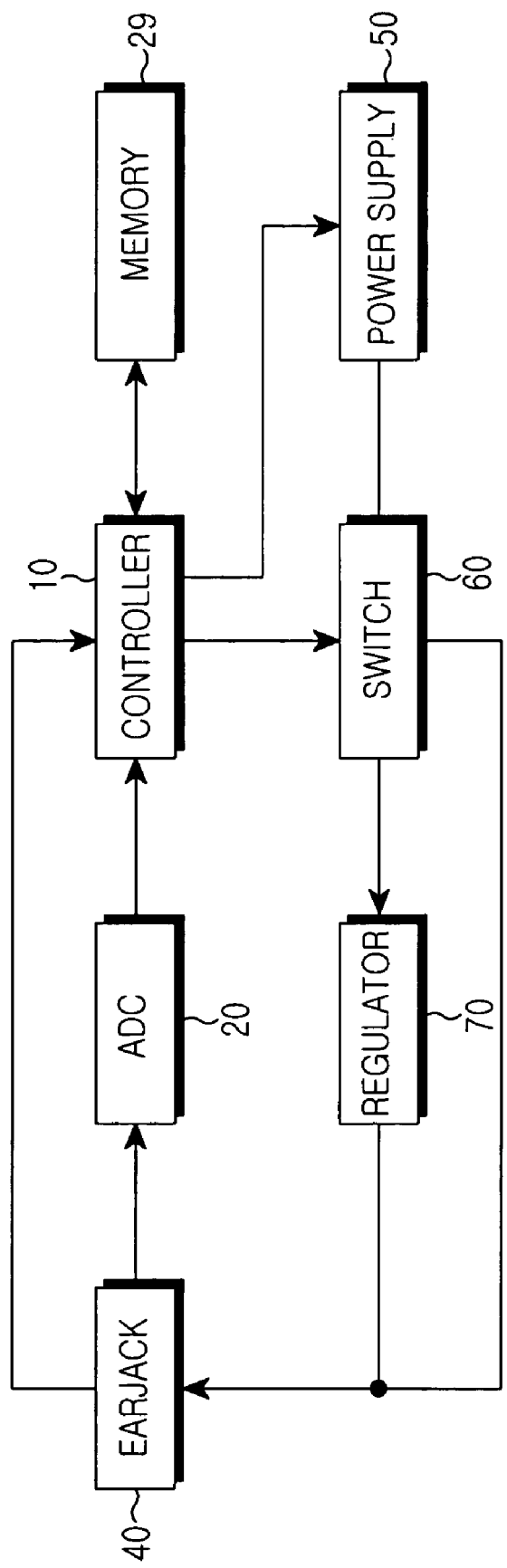
FIG. 1 is a block diagram illustrating a portable terminal having a multipurpose earjack according to an embodiment of the present invention.

An embodiment of the present invention will now be described in detail with reference to the accompanying drawings. In the drawings, the same or similar elements are denoted by the same reference numerals. A detailed description of known functions and configurations incorporated herein has been omitted for conciseness.

The present invention provides a multipurpose earjack in which various external accessories can be attached to or plugged into to perform their functions. In an embodiment of the present invention, it is assumed that the earjack has 10 pins. However, the number of pins of the earjack is not limited to 10, but can be increased according to the number of external accessories to be plugged therein.

Figure 2:
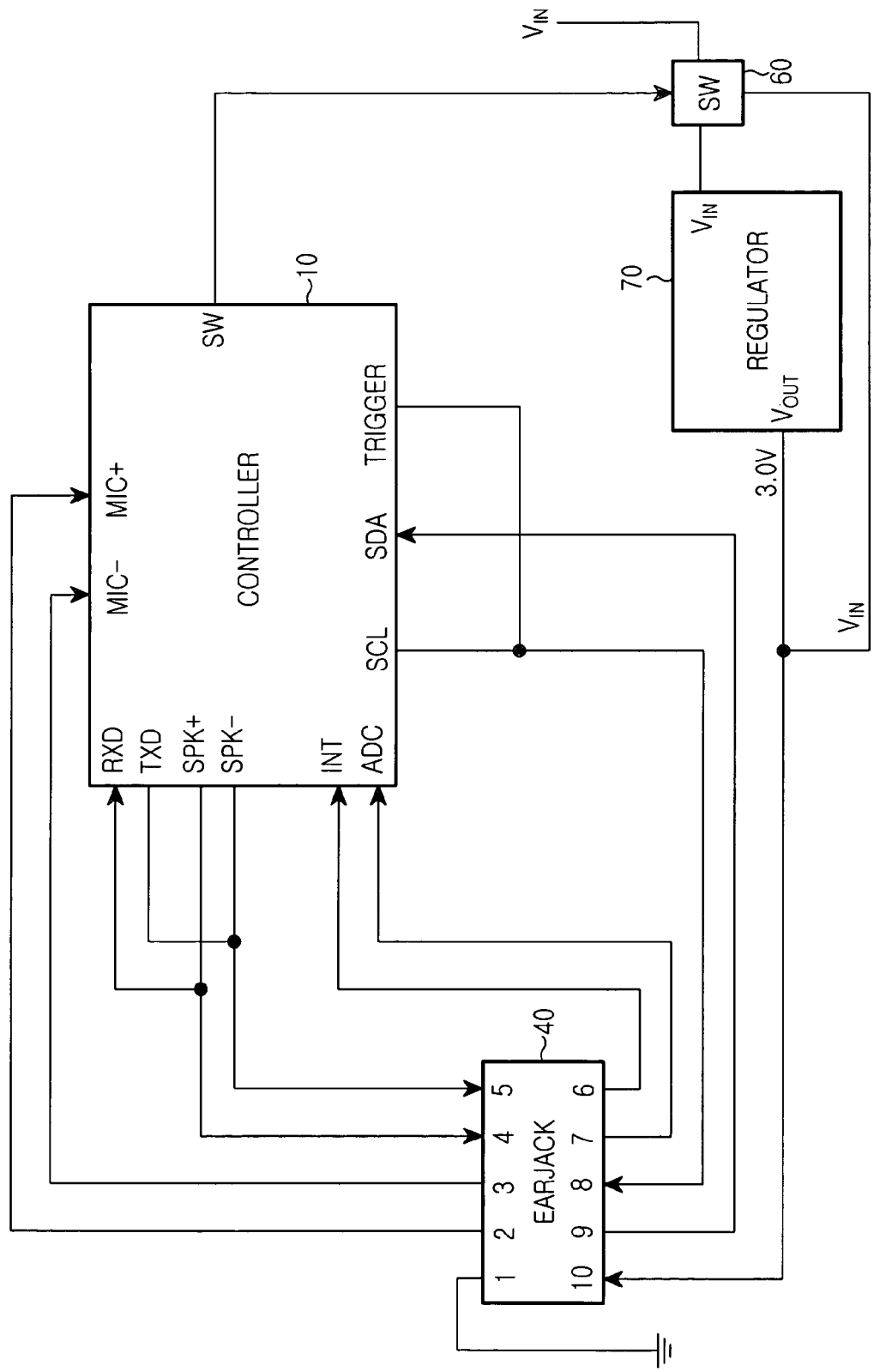
FIG. 2 is a detailed block diagram illustrating the multipurpose earjack of FIG. 1.

FIG. 1 is a block diagram illustrating a portable terminal having a multipurpose earjack according to an embodiment of the present invention, and FIG. 2 is a detailed block diagram illustrating the multipurpose earjack of FIG. 1.

Referring to FIGS. 1 and 2, an earjack 40 switches a voice call signal to an earphone when the earphone (not shown) is inserted. In contrast, the earjack 40 switches the voice call signal to a speaker when the earphone is removed. The 10-pin earjack 40 according to an embodiment of the present invention includes a ground pin 1, microphone pins #2 and #3, speaker pins #4 and #5, which also act as a received data pin and transmit data pin, respectively, an interrupt pin #6, an analog-to-digital conversion (ADC) pin #7, a serial clock pin #8, which also acts as a trigger pin, a serial data pin #9, and a power input pin #10.

The interrupt pin #6 generates an interrupt signal when an external accessory is inserted into the earjack 40, and the analog-to-digital conversion pin #7 is used in reading a resistance value of the external accessory plugged in the earjack 40.

The received data pin #4 receives data, and enables an external accessory plugged in the earjack 40 to perform a data reception function. Here, the external accessory can be an external camera, an external camera with a flash, and/or a Bluetooth module. The transmit data pin #5 transmits data, and enables an external accessory plugged in the earjack 40 to perform a data transmission function. Likewise, the external accessory can be an external camera, an external camera with a flash, and/or a Bluetooth module.

The serial clock pin #8 and the serial data pin #9 are pins for performing data communication, and enable an external accessory plugged in the earjack 40 to perform a data communication function. Here, the external accessory can be an FM stereo earphone (EP) and an MP3 player. The trigger pin #8 performs a flash function, and enables an external accessory plugged in the earjack 40 to perform the flash function. An external accessory such as an external flash can be plugged in the earjack 40.

Under the control of the controller 10, an ADC section 20 converts a resistance value of an external accessory plugged in the earjack 40 into an ADC value. A memory 29 can be comprised of a program memory and a data memory. The program memory stores programs for controlling a general operation of the portable terminal and programs capable of enabling a plurality of external accessories to perform their functions via the earjack 40 according to an embodiment of the present invention. The data memory temporarily stores data generated during execution of the programs. The memory 29 stores a table including ADC values of accessories to be plugged in the earjack 40.

A power supply 50 provides electric power to the external accessories that are attached to the earjack 40. Under the control of the controller 10, a regulator 70 provides a voltage output from the power supply 50 to an external accessory that requires a constant voltage. The external accessory receiving a constant voltage from the regulator 70 includes an FM stereo earphone, an MP3 player, an external camera, and a Bluetooth module. It should be appreciated by those skilled in the art that the accessories listed are examples, and the embodiment of the present invention is not limited to the accessories listed.

The controller 10 controls the overall operation of the portable terminal. When an external accessory is plugged in the earjack 40, generating an interrupt signal, the controller 10 controls the ADC section 20 so that it converts a resistance value of an external accessory plugged in the earjack 40 into an ADC value. In addition, the controller 10 compares the ADC value of the external accessory, converted by the ADC section 20, with ADC values of external accessories, stored in the memory 29, to determine the type of external accessory plugged in the earjack 40, and performs the corresponding function.

A description will now be made of an operation in which external accessories perform their functions through the earjack 40 of the portable terminal. If an external accessory is plugged in the earjack 40, generating an interrupt signal, then the controller 10 converts a resistance value of the plugged-in external accessory into an ADC value by controlling the ADC section 20. The controller 10 compares the ADC value of the external accessory with the table stored in the memory 29 to determine a type of the plugged-in external accessory, and performs the corresponding function.

Figure 3:
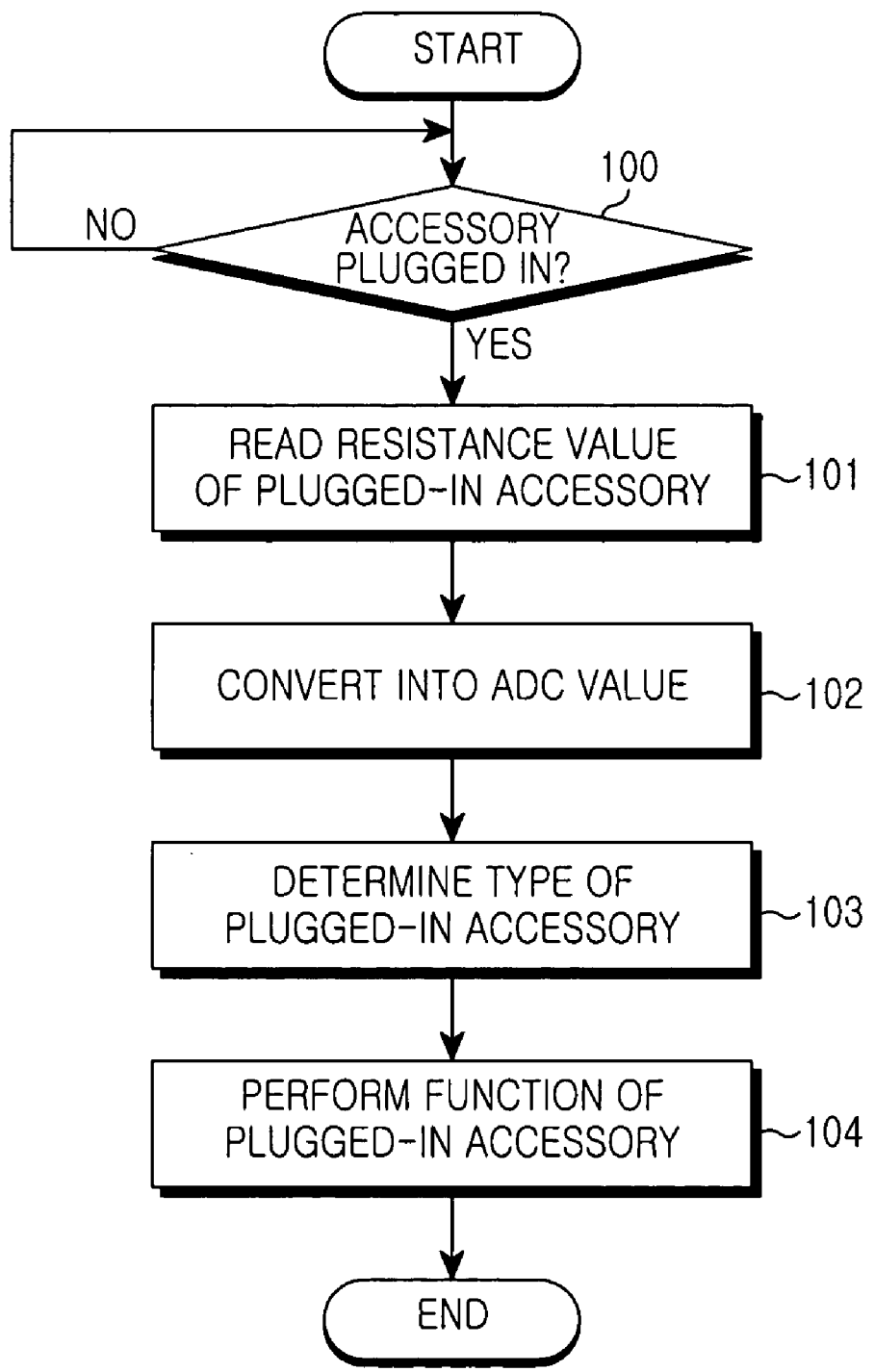
FIG. 3 is a flowchart illustrating a method for controlling a portable terminal having a multipurpose earjack according to an embodiment of the present invention.

FIG. 3 is a flowchart illustrating a method for controlling a portable terminal having a multipurpose earjack according to an embodiment of the present invention.

Table 1 below illustrates external accessories that can be plugged in a 10-pin earjack 40, and pins of the earjack 40 which are used when the external accessories are plugged in the earjack 40.

TABLE 1

| PIN | normal EP | stereo EP | FM stereo EP | MP3 | External Flash | External Camera | External Camera with Flash | Bluetooth |
| --- | --- | --- | --- | --- | --- | --- | --- | --- |
| 1 | GND | GND | GND | GND | GND | GND | GND | GND |
| 2 | MIC+ | MIC+ | MIC+ | MIC+ | | | | |
| 3 | MIC− | MIC− | MIC− | MIC− | | | | |
| 4 | SPK+ | SPK-R | SPK-R | SPK-R | | RXD | RXD | RXD |
| 5 | SPK− | SPK-L | SPK-L | SPK-L | | TXD | TXD | TXD |
| 6 | INT | INT | INT | INT | INT | INT | INT | INT |
| 7 | ADC | ADC | ADC | ADC | ADC | ADC | ADC | ADC |
| 8 | | | SCL | SCL | TRIGGER | | | |
| 9 | | | SDA | SDA | | | | |
| 10 | | | 3V SUPPLY | 3V SUPPLY | BATTERY SUPPLY | 3V SUPPLY | BATTERY SUPPLY | 3V SUPPLY |

Table 2 below illustrates resistance values of external accessories, stored in the memory 29, and ADC values corresponding to the resistance values according to an embodiment of the present invention.

TABLE 2

| External Accessory | Resistance Value | ADC Value |
| --- | --- | --- |
| normal EP | 1 KΩ | 1~10 |
| stereo EP | 2 KΩ | 11~20 |
| FM stereo EP | 3 KΩ | 21~30 |
| MP3 | 4 KΩ | 31~40 |
| External Flash | 5 KΩ | 41~50 |
| External Camera | 6 KΩ | 51~60 |
| External Camera with Flash | 7 KΩ | 61~70 |
| Bluetooth | 8 KΩ | 71~80 |

With reference to FIGS. 1 to 3 and Tables 1 and 2, a detailed description will now be made of a method for controlling a portable terminal with a multipurpose earjack 40 according to an embodiment of the present invention.

When a stereo earphone is plugged in the earjack 40, an interrupt signal is generated via a pin #6, or an interrupt pin INT, of the earjack 40. In step 100, the controller 10 detects the interrupt signal and determines that an external accessory is plugged in the earjack 40. In step 101, the controller 10 reads a resistance value 2 KΩ of the stereo earphone via a pin #7, or an analog-to-digital conversion pin ADC, of the earjack 40. Thereafter, in step 102, the controller 10 converts the resistance value 2 KΩ of the stereo earphone into an ADC value by controlling the ADC section 20. If the ADC value of the stereo earphone is 20, the controller 10 searches the table (shown in Table 2) stored in the memory 29 for an external accessory having an ADC value of 20 in step 103, detecting that the external accessory currently plugged in the earjack 40 is a stereo earphone. After detecting that the external accessory plugged in the earjack 40 is a stereo earphone, the controller 10 controls in step 104 a microphone port (MIC+ and MIC−) thereof so as to perform a microphone function via a pin #2 and a pin #3, or microphone pins MIC+ and MIC− of the earjack 40. In addition, the controller 10 controls a speaker port (SPK+ and SPK−)

thereof so as to perform a speaker function via a pin #4 and a pin #5, or speaker pins SPK+ and SPK−.

Alternatively an example using different values can be provided. For example, when an MP3 player is plugged in the earjack 40, an interrupt signal is generated via the pin #6, or the interrupt pin INT, of the earjack 40. In step 100, the controller 10 detects the interrupt signal and determines that an external accessory is plugged in the earjack 40. In step 101, the controller 10 reads a resistance value 4 KΩ of the MP3 player via the pin #7, or the analog-to-digital conversion pin ADC, of the earjack 40. Thereafter, in step 102, the controller 10 converts the resistance value 4 KΩ of the MP3 player into an ADC value by controlling the ADC section 20. If the ADC value of the MP3 player is 35, the controller 10 searches the table stored in the memory 29 for an external accessory having an ADC value of 35 in step 103, detecting that the external accessory currently plugged in the earjack 40 is an MP3 player. After detecting that the external accessory plugged in the earjack 40 is an MP3 player, the controller 10 controls in step 104 the microphone port (MIC+ and MIC−) thereof so as to perform a microphone function via the pin #2 and the pin #3, or the microphone pins MIC+ and MIC− of the earjack 40. In addition, the controller 10 controls the speaker port (SPK+ and SPK−) thereof so as to perform a speaker function via the pin #4 and the pin #5, or the speaker pins SPK+ and SPK−. Moreover, the controller 10 controls data communication ports SCL and SDA thereof so as to perform data communication via a pin #8 and a pin #9, or a serial clock pin SCL and a serial data pin SDA. Further, the controller 10 provides electric power from the power supply 50 to the regulator 70 via a switch port SW (not shown) by turning on a switch 60. The regulator 70 then provides a constant voltage of 3V to the MP3 player via a pin #10 of the earjack 40 so that the MP3 player can operate.

By way of another example, when an external flash is plugged in the earjack 40, an interrupt signal is generated via the pin #6, or the interrupt pin INT, of the earjack 40. In step 100, the controller 10 detects the interrupt signal and determines that an external accessory is plugged in the earjack 40. In step 101, the controller 10 reads a resistance value 5 KΩ of the external flash via the pin #7, or the analog-to-digital conversion pin ADC, of the earjack 40. Thereafter, in step 102, the controller 10 converts the resistance value 5 KΩ of the external flash into an ADC value by controlling the ADC section 20. If the ADC value of the external flash is 45, the controller 10 searches the table stored in the memory 29 for an external accessory having an ADC value of 45 in step 103, detecting that the external accessory currently plugged in the earjack 40 is an external flash. After sensing that the external accessory plugged in the earjack 40 is an external flash, the controller 10 controls in step 104 a flash port TRIGGER thereof so as to perform a flash function via a pin #8, or a trigger pin TRIGGER of the earjack 40. At the same time, the controller 10 provides electric power from the power supply 50 to the external flash via the pin #10 of the earjack 40 so that the external flash performs a corresponding function.

In still another example, when an external camera with a flash is plugged in the earjack 40, an interrupt signal is generated via the pin #6, or the interrupt pin INT, of the earjack 40. In step 100, the controller 10 detects the interrupt signal and determines that an external accessory is plugged in the earjack 40. In step 101, the controller 10 reads a resistance value 7 KΩ of the external camera with a flash via the pin #7, or the analog-to-digital conversion pin ADC, of the earjack 40. Thereafter, in step 102, the controller 10 converts the resistance value 7 KΩ of the external camera with a flash into an ADC value by controlling the ADC section 20. If the ADC value of the external camera with a flash is 70, the controller 10 searches the table stored in the memory 29 for an external accessory having an ADC value of 70 in step 103, detecting that the external accessory currently plugged in the earjack 40 is an external camera with a flash. After detecting that the external accessory plugged in the earjack 40 is an external camera with a flash, the controller 10 controls in step 104 a received data port RXD thereof so as to perform a data reception function via a pin #4, or a received data pin RXD of the earjack 40. At the same time, the controller 10 controls a transmit data port TXD thereof so as to perform a data transmission function via a pin #5, or a transmit data pin TXD. In addition, the controller 10 provides electric power from the power supply 50 to the external camera with a flash via the pin #10 of the earjack 40 so that the external camera with flash performs a corresponding function.

The multipurpose earjack 40 according to an embodiment of the present invention can be applied to various external accessories such as a cellular phone, a Personal Communications Service (PCS) phone, a Global System for Mobile communication (GSM) phone, and a Personal Digital Assistant (PDA).

As can be appreciated from the foregoing description, the embodiment of the present invention can implement multimedia functions of various external accessories with one portable terminal having a multipurpose earjack, meeting various users' demands.

While the invention has been shown and described with reference to a certain embodiment thereof, it will be understood by those skilled in the art that various changes in form and details may be made therein without departing from the spirit and scope of the invention as defined by the appended claims.

What is claimed is:

1. A portable terminal communicably coupled to an external accessory, the external accessory being one of a plurality of external accessories, each of the plurality of external accessories being a different type and having differing functions, wherein at least one of the plurality of external accessories comprises an earphone having an earphone function, wherein each of the plurality of external accessories comprises a resistance value that corresponds to a type of external accessory, comprising:

an earjack comprising a plurality of communicable contacts for communicably coupling the external accessory via two or more of the plurality contacts, wherein a number of contacts used and a usage of each contact varies depending on the type of the communicably coupled external accessory, and further wherein one of the two or more contacts is an analog-to-digital conversion (ADC) contact used exclusively for detecting a resistance value of the communicably coupled external accessory;

an ADC section for converting a resistance value of the communicably coupled external accessory into an ADC value;

a memory for storing ADC reference values that correspond to resistance values of the plurality of external accessories; and a controller for controlling the ADC section to convert the resistance value of the communicably coupled external accessory into an ADC value, determining the type of the communicably coupled external accessory by comparing the converted ADC value with the ADC reference values stored in the memory, controlling the number and usage of the plurality of contacts to correspond to the communicably coupled external accessory, and performing a function of the communicably coupled external accessory.

2. The portable terminal of claim 1, wherein the communicable contacts of the jack comprises:
   a ground contact;
   a microphone contact;
   a speaker contact;
   an interrupt contact for detecting a communicably coupled external accessory;
   a received data contact for receiving data;
   a transmit data contact for transmitting data;
   a serial clock contact;
   a serial data contact for performing data communication in association with the serial clock contact; and
   a trigger contact for detecting a flash being communicably coupled.

3. The portable terminal of claim 1, further comprising:
   a power supply for powering the communicably coupled external accessory coupled; and
   a regulator for providing a constant voltage from the power supply to a communicably coupled external accessory that requires a constant voltage.

4. A method for controlling a portable terminal communicably coupled to an external accessory, the external accessory being one of a plurality of external accessories, each of the plurality of external accessories being a different type and having differing functions, wherein at least one of the plurality of external accessories comprises an earphone having an earphone function, wherein each of the plurality of external accessories comprises a resistance value that corresponds to a type of external accessory, wherein the portable terminal is communicably coupled to the external accessory via two or more of a plurality communicable contacts comprised by an earjack, wherein a number of contacts used and a usage of each contact varies depending on the type of the communicably coupled external accessory, and further wherein one of the two or more contacts is an analog-to-digital conversion (ADC) contact used exclusively for detecting a resistance value of the communicably coupled external accessory, comprising the steps of:
   (a) detecting a resistance value of the communicably coupled external accessory through the ADC contact;
   (b) converting the resistance value into an ADC value;
   (c) determining a type of external accessory communicably coupled based on the converted ADC value;
   (d) controlling the number and usage of the plurality of contacts to correspond to the communicably coupled external accessory; and
   (e) performing a function of the communicably coupled external accessory.

5. The method of claim 4, wherein the step (a) comprises the steps of:
   generating an interrupt signal via an interrupt contact when an external accessory is communicably coupled, the interrupt contact being one of the plurality of contacts comprised by the jack; and
   detecting insertion of the external accessory through the interrupt signal.

6. The method of claim 4, wherein the step (e) comprises the steps of:
   performing an earphone function or a stereo earphone function via a ground contact, a microphone contact and a speaker contact when the communicably coupled external accessory is an earphone or a stereo earphone, the ground, microphone and speaker contacts each being one of the plurality of contacts comprised by the jack;
   performing an FM stereo earphone function or an MP3 function via the ground contact, the microphone contact, the speaker contact, a serial clock contact and a serial data contact of the jack when the coupled external accessory is an FM stereo earphone or an MP3 player, the serial clock and serial data contacts each being one of the plurality of contacts comprised by the jack;
   performing a function of an external flash via the ground contact and a trigger contact of the jack when the coupled external accessory is an external flash, the trigger contact being one of the plurality of contacts comprised by the jack; and
   performing a function of an external camera, an external camera with a flash or a Bluetooth module via the ground contact, a received data contact and a transmit data contact when the plugged-in external accessory is the external camera, the external camera with a flash or the Bluetooth module, the received data and transmit data contacts each being one of the plurality of contacts comprised by the jack.

* * * * *